United States Patent
Bonn et al.

[11] Patent Number: 6,021,267
[45] Date of Patent: Feb. 1, 2000

[54] ASPECT RATIO PROGRAM FOR OPTIMIZING SEMICONDUCTOR CHIP SHAPE

[75] Inventors: Jeffrey P. Bonn, Essex Junction; Daniel N. Maynard, Craftsbury Common; Sharon B. Sisler, Waterbury Center; Richard C. Whiteside, Charlotte, all of Vt.

[73] Assignee: International Business Machines Corporation, Armonk, N.Y.

[21] Appl. No.: 08/925,513

[22] Filed: Sep. 8, 1997

[51] Int. Cl.⁷ ........................................ G06F 17/50
[52] U.S. Cl. ................................... 395/500.22; 395/500.2
[58] Field of Search ........................... 395/500.2, 500.22, 395/500.23; 364/468.28

[56] References Cited

U.S. PATENT DOCUMENTS

| | | | |
|---|---|---|---|
| 4,816,692 | 3/1989 | Rudert, Jr. ......................... | 250/492.22 |
| 5,305,222 | 4/1994 | Nakamura . | |
| 5,341,024 | 8/1994 | Rostoker ............................. | 257/620 |
| 5,404,309 | 4/1995 | Yamamoto et al. ................ | 395/500.2 |
| 5,416,722 | 5/1995 | Edwards . | |
| 5,450,332 | 9/1995 | Criscuoli et al. . | |
| 5,532,934 | 7/1996 | Rostoker ............................. | 395/500.11 |
| 5,553,273 | 9/1996 | Liebmann . | |
| 5,581,475 | 12/1996 | Majors . | |
| 5,612,893 | 3/1997 | Hao et al. . | |
| 5,636,131 | 6/1997 | Liebmann et al. . | |
| 5,663,076 | 9/1997 | Rostoker et al. ................... | 438/14 |
| 5,684,713 | 11/1997 | Asada et al. ....................... | 364/512 |
| 5,699,260 | 12/1997 | Lucas et al. ........................ | 364/468.28 |
| 5,822,214 | 10/1998 | Rostoker et al. ................... | 364/488 |
| 5,838,567 | 11/1998 | Boggio, Jr. ......................... | 364/468.28 |

Primary Examiner—Kevin J. Teska
Assistant Examiner—Leigh Marie Garbowski
Attorney, Agent, or Firm—DeLio & Peterson, LLC; Peter W. Peterson; Richard M. Kotulak

[57] ABSTRACT

A cost-based algorithm determines semiconductor chip aspect ratios which minimize lithographic processing costs and determines optimum chip matrices for various types of lithographic tools.

19 Claims, 5 Drawing Sheets

ASPECT RATIO PROGRAM FOR OPTIMIZING SEMICONDUCTOR CHIP SHAPE

BACKGROUND OF THE INVENTION

1. Field of the Invention

The present invention relates to the manufacture of semiconductor chips and, in particular, to the optimization of chip shape between different lithographic tools used to print the layers for the chips on a semiconductor wafer. More particularly, the present invention relates to a method which utilizes an algorithm to determine optimal chip shape for a given photolithographic tool set.

2. Description of Related Art

Manufacturing productivity improvement in fabrication of chips from semiconductor wafers has traditionally been focused on elements within the direct control of the manufacturing area. Multiple lithographic tools are typically used to print different layers and/or areas of the chips on a semiconductor wafer. These tool sets may have different types of tools with different capabilities, depending on the printing requirements and tool availability. Lithographic tool productivity improvements have typically been derived from increasing tool availability and reducing product rework. However, with little leverage remaining within manufacturing, significant opportunities for lithographic tool productivity improvement must be realized outside of the manufacturing environment.

In the past, chip fabricators used a simple algorithm which found an optimum matrix for a single predefined lithographic tool. Currently, semiconductor chips are designed without consideration for photolithographic tool optimization and matrixed based simply on engineering judgment. U.S. Pat. No. 5,305,222 describes the advantage of using an optimum matrix of chips in a lens field. To date, quantitative approaches have not been used to design and matrix chips with regard to critical photo tool productivity constraints, e.g., tool-types; lens field sizes, and tool costs, time and capacity.

It has been found that reducing the number of exposure steps per wafer is a key component for lithographic tool productivity improvement. Chip dimensions and matrixing constraints have been found to be the greatest factors which drive the number of steps. However, this has been difficult to determine because of the various different types of tools within a given tool set and their different capabilities.

Bearing in mind the problems and deficiencies of the prior art, it is therefore an object of the present invention to provide a method for optimizing chip size for a given set of different lithographic tools.

It is another object of the present invention to provide a method of determining optimum chip size based on lowest cost of production.

A further object of the invention is to provide a method of selecting optimum chip aspect ratio for processing by a desired number of different lithographic tools.

It is yet another object of the present invention to provide a method to compare photolithographic matrices by cost, where cost may be any weighting factor.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of optimizing efficiency of chip shape layout printed on semiconductors by a plurality of lithography tools comprising the steps of:

a) determining, for each of the lithography tools, possible unit cells and unit cell matrices printable by the tool at one exposure and at one chip aspect ratio, wherein a unit cell comprises a matrix of one or more chips to be printed;

b) determining, for each of the lithography tools, an overall tool cost based on the possible unit cells and unit cell matrices;

c) determining, for each of the lithography tools, a desired unit cell matrix based on cost;

d) repeating steps (a)–(c) for a different chip aspect ratio having the same area; and e) selecting a desired chip aspect ratio based on cost, wherein the cost equals any weighting factor.

The step (c) determination of desired unit cell matrix and step (e) selection of desired unit cell aspect ratio may be based on lowest monetary or other cost. The chip dimensions in the unit cell matrix may be rotated by 90° with respect to a tool lens field to determine a desired unit cell matrix based on cost. Preferably, the first aspect ratio in step (a) is one and the step (d) is repeated for larger aspect ratios up to a maximum desired aspect ratio. All of the unit cell matrices for each lithography tool determined in step (a) may or may not be multiples of one another.

As an alternative to steps (d)–(e) above, the method may comprise:

d) repeating steps (a)–(c) with the chip dimensions rotated by 90 degrees with respect to the tools lens field, to determine the preferred chip orientation;

e) repeating steps (a)–(d) with alternate sets of lithography tools, a different number of levels per tool, or with some tool's lens field rotated with respect to each other; and f) selecting a desired chip aspect ratio based on cost, wherein the cost equals any weighting factor.

The user provides a weighting factor for each lithography tool. These weights may be used to obtain a more efficient matrix on particular tools, which is useful for production line balancing.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–15 of the drawings in which like numerals refer to like features of the invention. Features of the invention are not necessarily shown to scale in the drawings.

This application describes a method to quantitatively compare unit cells, to select optimum unit cell (kerf) matrices, and to select optimum dimensions. As used herein, the term unit cell refers to a repeating pattern of chip and scribe to be lithographically printed onto a semiconductor wafer in the production of semiconductor chips. The term unit cell matrix, and the term kerf matrix refer to a repeating pattern of one or more unit cells. The terms scribe and kerf both refer to the area around the chip which is sacrificed to scrap as the chips are cut from the wafer. The invention uses a cost-based analysis program to guide a designer to improved productivity. To encourage productive chip designs, lithographic costing is preferably based on productivity. Reduction of steps with improved chip matrixing and reduction of non-production steps are also achieved.

When multiple types of photolithography tools are used in a semiconductor manufacturing process, it is desirable to have each tool operate at its greatest efficiency. For a step and repeat photolithography tool, high efficiency is achieved by printing the greatest possible area per exposure.

The shapes printed by each photolithography tool must overlay with each other. This requires that each tool use the same unit cell or repeating pattern of chip and scribe. Each photolithography tool may print one or more unit cells per exposure. A matrix of unit cells is referred to herein as a kerf matrix. For some products, it is required to select kerf matrices that are multiples of each other.

The present invention provides a method for layout optimization which evaluates unit cells and kerf matrices by comparing processing cost to select an optimum kerf matrix for each photolithography tool and one optimum unit cell for a set of photolithography tools using a recursive function and user selected tool weighting factors.

This invention has two components. The first teaches an aspect ratio program that enables a designer, once the required chip and kerf areas are known, to choose the chip shape, square to highly rectangular, which will result in the most productive photo tool utilization. Aspect ratio refers to the ratio of the length (X) dimension to the width (Y) dimension of the unit cell or chip. The cost-based aspect ratio program considers photo tool productivity components which include chip and kerf size, orientation, photo tool cost per hour and stepping speed, as well as technology which defines the number of levels run on each photo tool-type. The program determines the lithographic manufacturing cost as a function of chip aspect ratio (shape).

The second component of this invention provides a matrixing program that enables reticle layout designers to choose the optimum chip orientation and matrix which will result in the most productive lithographic tool utilization. This program considers capacity as well as the items considered for the aspect ratio program. These programs can quantitatively determine optimum chip shape and matrix at the various design stages.

Figure 1:
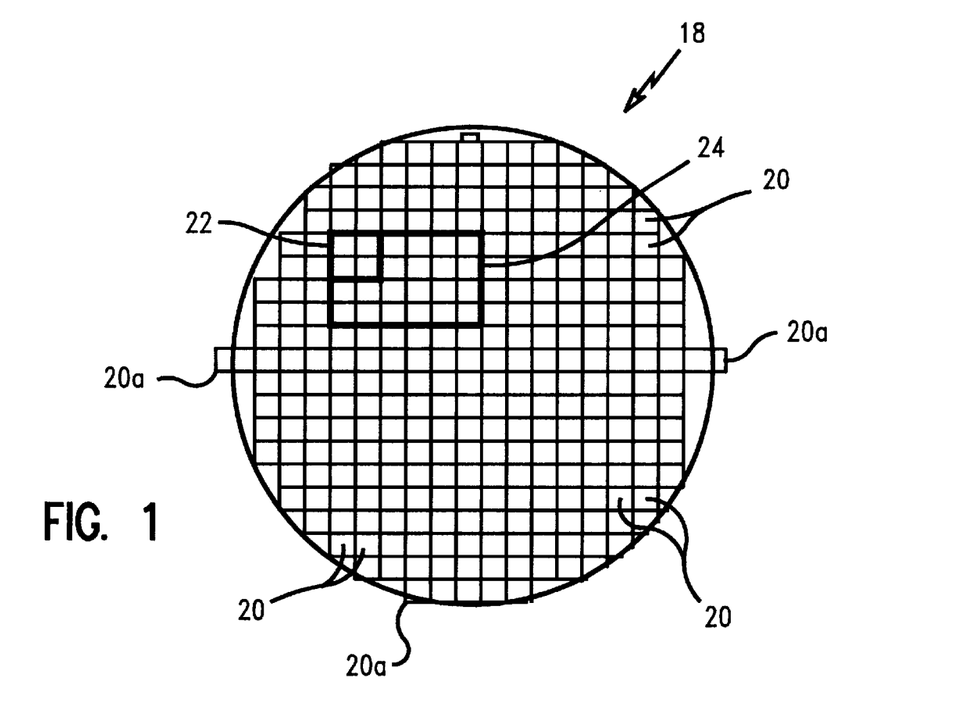
FIG. 1 is a top plan view of a wafer with a superimposed pattern of individual chips.

In FIG. 1 there is shown a wafer 18 on which is superimposed a pattern of individual chips 20 which cover substantially all of the wafer. The chips 20 shown are rectangular in configuration and are arranged to conform to the circular edges of wafer 18 to the extent possible. However, chips 20a whose edges or corners fall outside of the diameter of the wafer are unusable.

Figure 2:
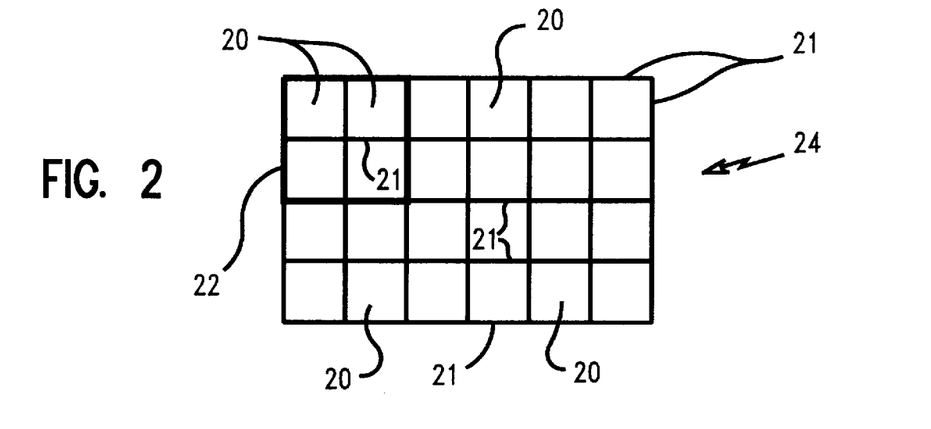
FIG. 2 is an enlargement of a unit cell (kerf) matrix from FIG. 1.
Figure 3:
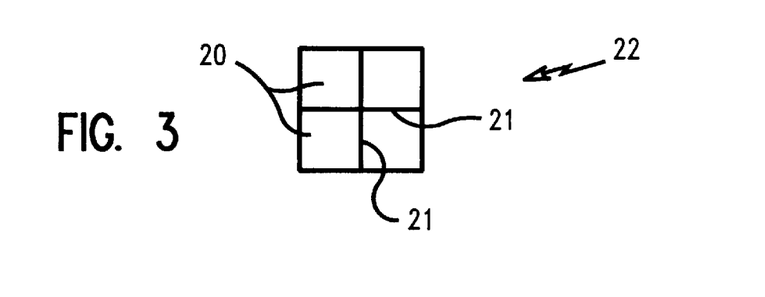
FIG. 3 is an enlargement of a unit cell from FIG. 2.

A unit cell 22 comprising a 2×2 matrix of chips 20 is shown in more detail in FIGS. 2 and 3. As used herein, the unit cell has one or more chips to be printed in a repeating pattern. Between each chip 20 there is a provided a scribe 21 of a desired width, which is used to accommodate the cut made to eventually separate the chips formed on wafer 18. As shown in an enlarged view in FIG. 2, a kerf matrix 24 from wafer 18 comprises a matrix of unit cells 22, here shown by way of example as a 3×2 matrix of unit cells 22.

Lithographic tools run most efficiently when they process wafers with the fewest number of exposure steps. If they can process a wafer with half as many steps, they will run almost twice as fast. The shape and size of the chip determines the number of steps. A single chip or matrix of chips that fully fills the tool's lens field is best. A lithographic tool is least efficient when a single chip uses just over half of the lens field in both dimensions.

Figure 4A:
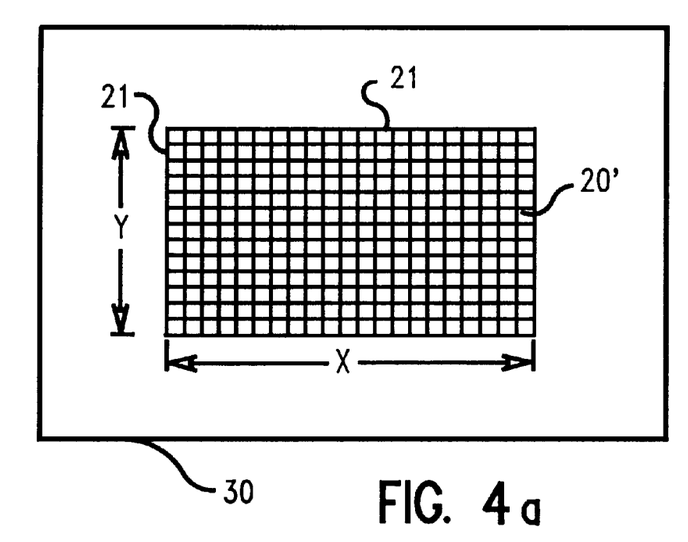
FIG. 4a is a top plan view of a worst case of a unit cell filling a lithographic tool lens field.
Figure 4B:
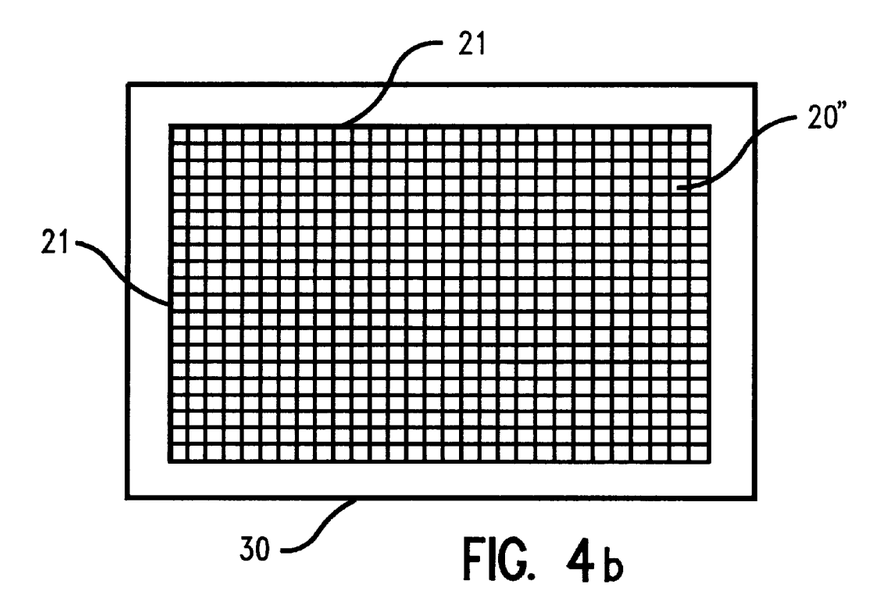
FIG. 4b is a top plan view of a best case of a unit cell filling a lithographic tool lens field.

Worst and best case scenarios for filling the lens field of a lithographic tool are shown in FIGS. 4a and 4b, respectively. In FIG. 4a, showing a worst case scenario, lens field 30 of a lithographic tool can only accommodate one chip 20' (here equal to a unit cell), since any matrix of chip or unit cell 20' would be too large to fit within lens field 30 given the X and Y dimensions. By contrast, a best case fill for a single chip or unit cell 20" is shown in FIG. 4b, wherein the X and Y dimensions of the chip matrix fills essentially all the usable area of lens field 30. A worst case unit cell or chip size may require about four times as many exposures as the best case unit cell or chip size because of its inefficient utilization of space. For example, if the chip in FIG. 4a were slightly smaller, a 2×2 matrix of four chips could be printed instead during one exposure.

Figure 5:
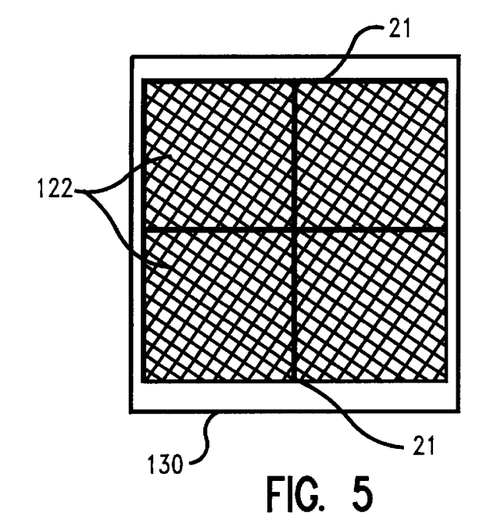
FIG. 5 is a top plan view of a 2×2 matrix of rectangular unit cells in a lithographic tool lens field.
Figure 6:
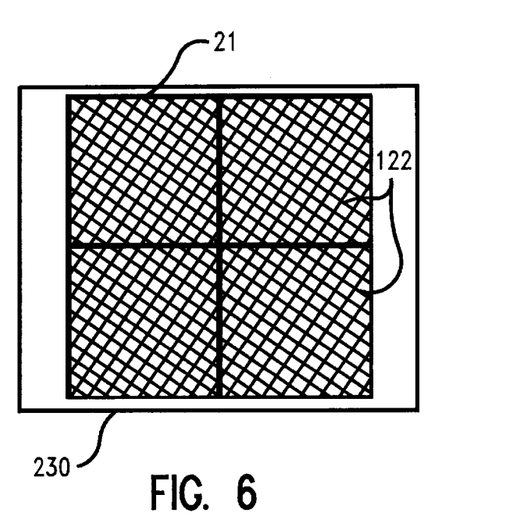
FIG. 6 is a top plan view of a 2×2 matrix of the same rectangular unit cells as in FIG. 5 in a different lithographic tool lens field.
Figure 7:
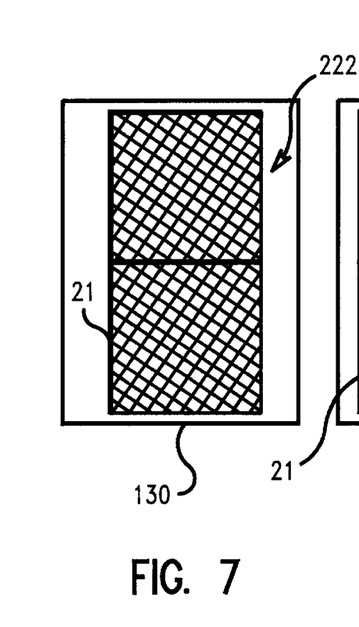
FIG. 7 is a top plan view of a 2 chip unit cell in a lithographic tool lens field.
Figure 8:
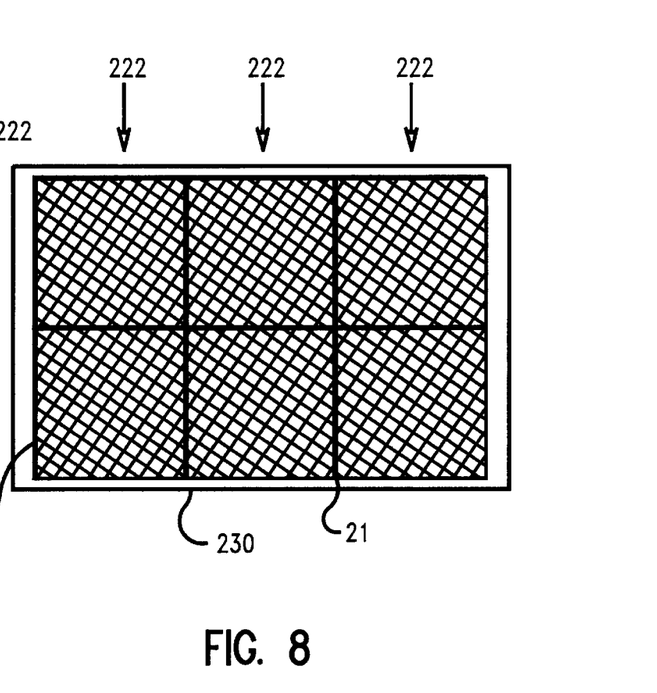
FIG. 8 is a top plan view of a 1×3 matrix of the same unit cell as in FIG. 7 in a different lithographic tool lens field.

Typically, several types of lithographic tools are used to process the same wafers, and the fields for these tools have different shapes and sizes. Since the scribe structures must overlay one another, the same fundamental layout of unit cell, or matrix of unit cells, must be used on each tool type. The unit cell selected for a smaller field tool can affect the productivity of a larger field tool. FIG. 5 shows an efficient 2×2 matrix of unit cells 122 on a Nikon 8 photolithographic printing tool lens field 130 and FIG. 6 shows an inefficient matrix of the same 2×2 matrix of unit cells 122 on a Micrascan II photolithographic printing tool lens field 230. FIG. 7 shows a less efficient Nikon 8 two (2) chip unit cell 222, but a better 1×3 matrix of the same 2 chip unit cell 222 is shown in FIG. 8 in the Micrascan II photolithographic lens field. To obtain the best productivity from a set of lithographic tools, a unit cell must be selected which minimizes the overall cost of lithographic processing.

Cost Analysis

To optimize chip matrixing, a cost-based algorithm may be employed in accordance with the present invention. Lithographic processing is a large portion of the total wafer manufacturing cost. One factor of lithographic processing cost is the number of steps on the wafer, which is calculated for a given unit cell. Another factor is tool processing speed, which varies with tool type, and is related to the number of steps. A third factor, each tool's hourly cost, is derived from a cost-of-ownership analysis. A fourth factor is the number of times the wafer visits each type of tool which varies with the technology. From this information, the algorithm provided in the invention calculates the processing cost for a given unit cell, with a given technology, on a given combination of lithographic tools.

Another cost criteria which may be considered in the algorithm of the present invention is the amount of wafer area lost to unproductive scribes. Since a unit cell's internal scribes may be narrower than its edge scribes, different possible unit cells may have a different total scribe area. The algorithm adds the cost of the scribe area to the processing cost to determine the overall processing cost. This is shown as:

Area Loss Cost=(1.0−AC/TA)*Fab cost where AC is the area of the chips in the unit cell, TA is the total area (in mm$^2$) of the unit cell, and Fab cost is the total cost of manufacturing a wafer in the production line.

Lithographic Cost=Σ#Shots(i)/Tool(i) Stepping Rate*Tool(i) Cost/Hour*#Levels on Tool(i)*Tool(i) Weighting Factor+Area Loss Cost where the formula is calculated for each Tool(i) and #Shots is the number of shots needed on this tool for a particular unit cell, Stepping Rate is the tool's stepping rate in shots/hour, Cost/Hour is the tool's cost/hour, and Weighting Factor is an adjustment factor for capacity.

Understanding costs makes it possible to optimize chip designs and matrices that involve many variables. The value of a step reduction issue for a given scenario can also be quantified, which helps to determine if its implementation is warranted and to prioritize activities.

Chip Aspect Ratio Optimization

Figure 9:
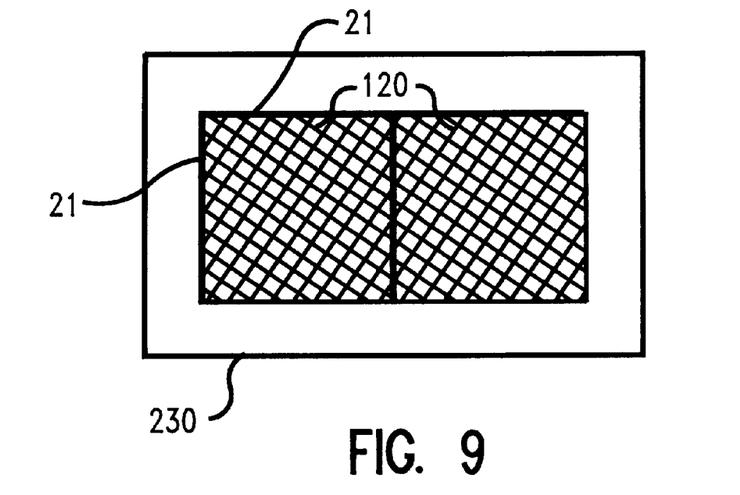
FIG. 9 is a top plan view of a 1×2 matrix of square unit cells in a lithographic tool lens field.
Figure 10:
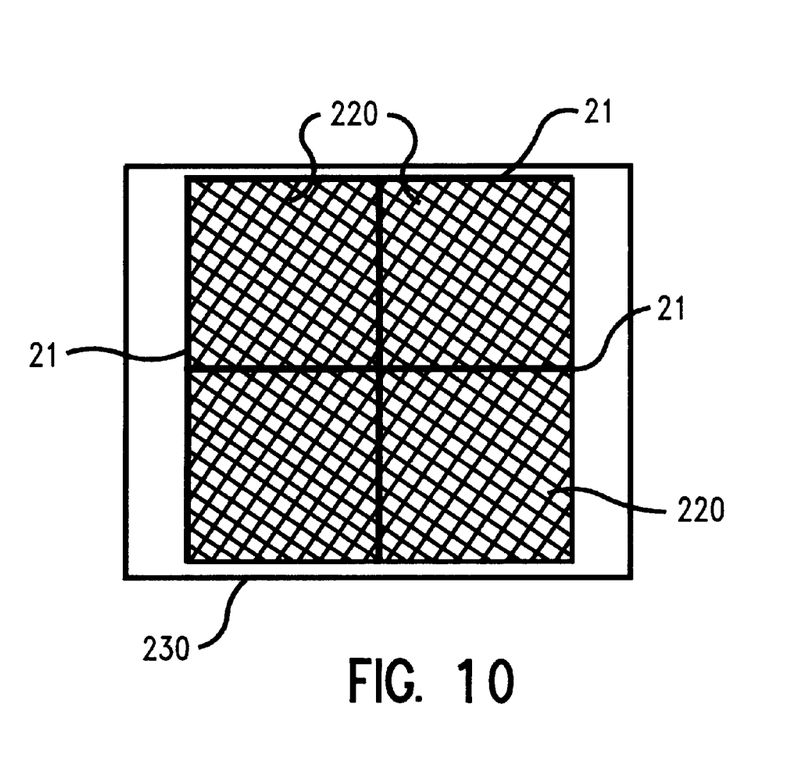
FIG. 10 is a top plan view of a 2×2 matrix of rectangular unit cells having the same area, but different aspect ratio, of the unit cells of FIG. 9 in the same lithographic tool lens field.

Lithographic processing cost varies with chip size because different chip sizes and shapes fill the various lens fields differently, some more efficiently than others. A change in the aspect ratio of chips or unit cells may dramatically increase the efficiency of printing, as shown in FIGS. 9 and 10. In FIG. 9, individual chips or unit cells 120, which are square in configuration, can be fit in only a 1×2 matrix within Micrascan lens field 230. However, as shown in FIG. 10, by altering the aspect ratio (the ratio of X to Y dimension), such that the chip still have the same area (X×Y), a 2×2 matrix of single chips or unit cells 220 can be fit within lens field 230 and printed by a single tool in one exposure.

For example, an 11×11 mm chip may be near the edge of a matrix size limit. If it the chip can instead be designed as a 10×12.1 mm chip having the same area, the matrix doubles for the Micrascan lens field (FIG. 10). In such extreme cases, small changes in chip aspect ratios cut lithographic processing costs almost in half.

An algorithm to analyze aspect ratio is based on the matrix algorithm described below which incorporates the above cost analysis. It determines the lithographic processing cost for a range of chip dimensions with the same area. The designer must then weight any lithographic processing cost variation against other design constraints, notably packaging and the number of chips per wafer, when choosing the optimum chip dimensions. Very high aspect ratio designs tend to provide fewer chips per wafer because their longer scribes waste more space on the wafer. Square chips tend to provide the most chips per wafer, but not necessarily the best lithographic tool usage.

Chip Matrix Optimization Algorithm

Once a chip is designed, it must be optimally fit, or matrixed, for the various lithographic tools on which it will be run. A matrix algorithm determines the optimum unit cell for a set of lithographic tools based on the cost algorithm described previously. As described previously, this matrix algorithm was optimized for a single lithographic tool based on lens utilization. Subsequently, the algorithm determines the unit cell and matrices which provide the lowest processing cost. Selecting the best unit cell and its matrices is a recursive process. As the algorithm finds the cost of a given unit cell on a given tool, it evaluates the cost of matrixing that unit cell on large tools. This scheme may support any number of lithographic tool types.

Matrix Optimization Options

The present invention also provides further options to improve matrixing:

Chip Rotation: Some chips matrix into lens fields better if they are rotated 90 degrees. The matrix algorithm compares the lithographic processing cost of the rotated design to the normal design, and chooses the orientation with the lower cost.

Figure 11:
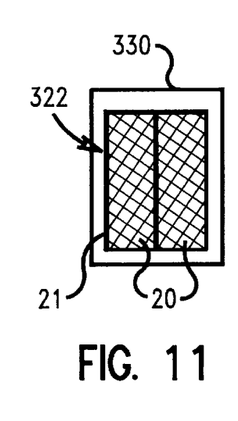
FIGS. 11 is a top plan view of a lens field in which a two chip unit cell may be printed for each exposure.
Figure 12:
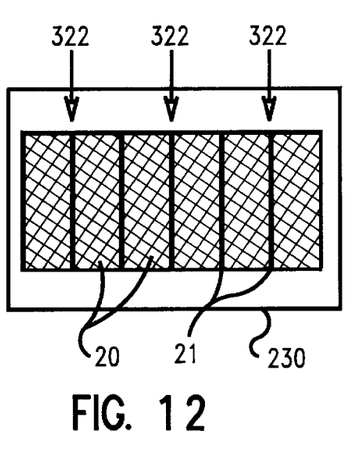
FIG. 12 is a top plan view of a different lens field oriented to fit a 1×3 matrix of the same unit cells shown in FIG. 11.
Figure 13:
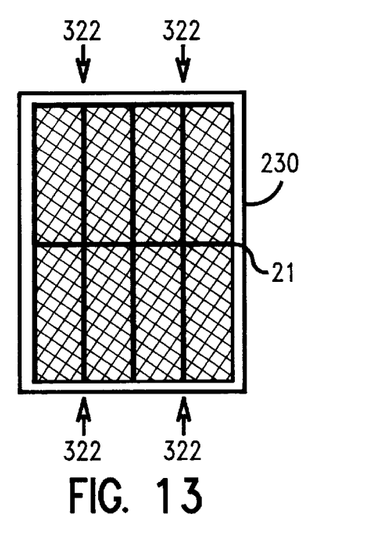
FIG. 13 is a top plan view of the same lens field of FIG. 12 rotated by 90° with respect to the other to allow a 2×2 matrix of the same unit cells of FIG. 12.
Figure 14:
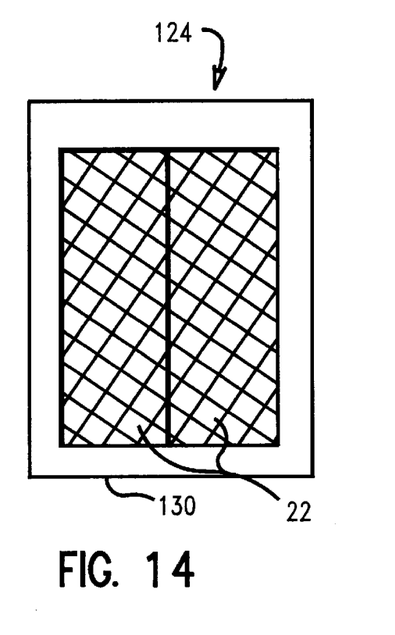
FIG. 14 is a top plan view of a 1×2 kerf matrix of unit cells 22 in a lens field.

Flexible-Field Orientation: Rotating one tools' field in relationship to another, when appropriate, can reduce the number of steps. FIGS. 11–13 show a case where rotating a tools lens field makes it possible to print eight chips per exposure instead of six. For example, a Nikon 6 lens field 330 (FIG. 11) permits a two chip unit cell 322 to be printed for each exposure. A Micrascan II lens field 230 oriented to fit a 1×3 matrix of unit cells 322 (FIG. 12) represents an improvement in efficiency. However, a further improvement may be realized by rotating the unit cells 322 or the lens field 230 by 90° with respect to the other to allow a 2×2 matrix of unit cells 322 to be printed at each exposure (FIG. 13). To rotate field boundaries, at least one tool must have the capability for dual-wafer orientation, and the scribe must be designed to support the rotation. The matrix algorithm of the present invention provides this option. Flexible field orientation with the combination of Nikon 8 and Micrascan II fields has been found to achieve a 10% productivity gain for typical chip sizes.

Figure 15:
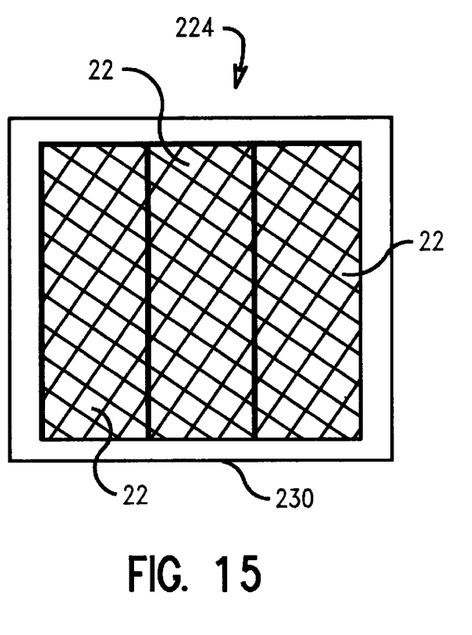
FIG. 15 is a top plan view of a non-multiple 1×3 kerf matrix of the unit cells of FIG. 14 in a different lens field.

Cross-Field Boundary Stepping: Crossing one tool's field boundary with another, when appropriate, can also reduce the number of steps. A kerf (unit cell) matrix of one tool is typically a multiples of a kerf matrix of another tool. However, the present invention permits cross-field boundary stepping where the kerf matrix of one tool is not a multiple of the kerf matrix of another tool. For example, in FIG. 14, a 1×2 kerf matrix 124 of unit cells 22 fit in a Nikon 8 lens field 130. In FIG. 15, a non-multiple 1×3 kerf matrix 224 of unit cells 22 fits a Micrascan II lens field 230. If the field boundaries in FIGS. 14 and 15 could not be crossed, either the Nikon 8 or the Micrascan II would have to use a less efficient matrix. When the cross-field boundary feature is enabled, the matrixing algorithm considers every possible unit cell matrix on the smallest tool. When not crossing field boundaries, it always uses a single unit cell matrix on the smallest tool. All other tools must use a multiple of their next smaller tools unit cell matrix. The ability to cross field boundaries, then, depends on the overlay limits of the technology and tools involved. This limit can be extended with appropriate overlay analysis techniques. The benefit of cross-field boundary stepping varies greatly depending on the tools involved and if flexible field orientation is an option.

Smaller Field Tool Exclusion From Matrix: The matrix algorithm can also decide between different sets of lithographic tool types. It might be possible to run a product on the Nikon 6, Nikon 8, Micrascan II and Nikon 4425, or to run it on just the three larger tools. The algorithm finds the best matrixing for each case, compares the two costs, and reports the better choice. Comparing costs makes it possible to use smaller field tools only on products where their matrices do not impact the more expensive larger field tools. Excluding Nikon 6 from a tool set combination of higher model Nikons and Micrascans may provide about a 10% productivity improvement.

Capacity Balance: The matrix algorithm has adjustable weights for each type of lithographic tool so that capacity planners can control workloads. When a tool's weight is increased, the algorithm tends to select a more efficient matrix for it. Weighting a tool can help to relieve fabricator bottlenecks by optimizing for the bottleneck tool at the expense of other tools.

EXAMPLE

The preferred algorithm of the present invention selects an optimum unit cell and kerf matrice for given chip and scribe specifications. The output of the algorithm is a list of optimum kerf matrices (one for each type of photolithography tool) and a single unit cell which is used on all of the tools. The algorithm preferably uses processing cost as a basis for comparison. Each tool makes exposures at a certain rate, and has a known hourly operating cost, and the number of exposures needed to process a wafer may be estimated. Thus, the algorithm can estimate the cost of processing a wafer with any unit cell and any kerf matrix, and compare it to any other unit cell and kerf matrix. Since the unit cell or kerf matrix selected on one type of photolithography tool may affect the efficiency of other tools, the algorithm also uses a recursive function to select a set of kerf matrices that gives optimum processing cost.

The algorithm can be run for any chip dimensions. By exercising the algorithm across a range of equal area chip shapes (from square to a user specified maximum aspect ratio) it is possible to find chip dimensions that give optimum photolithography tool productivity. Because the chips may be rectangular, and the usable lens fields of teach tool may be rectangular, the algorithm may also evaluate the benefit of rotating the chip by 90 degrees. This can result in a more efficient matrix and lead to greater tool productivity.

If a production line is out of balance, where some tool types are more heavily loaded than others, it may be useful to reduce the workload on the busiest tools. Weighting factors in the algorithm make possible to favor specific tool types over others. The more heavily weighted tools tend to become more efficient at the expense of other tools.

The preferred main program and associated subroutines employed therein are shown below. Files used for the main program are as follows:
- Technology Menu—Defines the Kerf file name, two sets of tools, and a number of levels for each tool
- Tool Profiles—One per tool, defines lens field size
- Kerf Profiles—Scribe (kerf) widths, weight given to each tool (to balance product line)

User input to the main program is as follows:
- Chip size, Chip technology, maximum aspect ratio, number of sizes to evaluate.

MAIN PROGRAM

The steps of the main program are as follows
Step 1:
Get the User's Input
Step 2:
Read number of levels of each tool type.
Step 3:
Read the tool profiles.
Step 4:
Read the Kerf profile
Step 5:
Generate a tool array data structure defining each tool's valid kerf matrices. For each kerf matrix, generate a data structure defining its valid unit cells.
Step 6:
For 1 to Number of Aspect Ratio Sizes
   Step 6a:
      Calculate the chip dimensions using Algorithm A (described below)
   Step 6b:
      Find and output optimum matrixing and cost using Algorithm B (described below)
Step 7:
End of loop.

The data structure elements used in the main program are as follows:
- Set of tools—An array of integers, one element per tool.
- Tool Array—An array of tool structures.
- Tool—Pointer to an array of kerf matrices.
- Kerf Matrix—1. X and Y size of the matrix in kerfs.
  2. X and Y periodicity of the matrix
  3. Pointer to an array of unit cells.
- Unit Cell—1. X and Y size of the unit cell in chips.
  2. X and Y periodicity of the unit cell.

| DATA STRUCTURE ORGANIZATION | | | |
|---|---|---|---|
| Tool Array | Tool #1 | | |
| | Tool #2- - - | kerf matrix | |
| | Tool #3 | kerf matrix | |
| | | kerf matrix- - - | unit cell |
| | Tool #N | | unit cell |
| | | kerf matrix | unit cell |
| | | | unit cell |

ALGORITHM A—ASPECT ROUTINE

The steps for implementing the Aspect Routine are shown below. Inputs are:

a: chip area
j: iteration number
Mi: maximum number of iterations
Ma: maximum aspect ratio
Step A1:
first X=sqrt (a)
Step A2:
last X=area/sqrt (a/Ma)
Step A3:
xincr=)last X-first X_/(Mi-1)
Step A4:
X=first X+(xincr*j)
Step A5:
Y=area/X Algorithm A returns X and Y chip dimensions for each iteration of an aspect ratio loop. On the first iteration, it returns X and Y dimensions equal to the square root of the chip area. On the last iteration, it returns X and Y dimensions such that X/Y is equal to the maximum aspect ratio. The other iterations return chip dimensions with aspect ratios between square and maximum.

ALGORITHM B—KERF MATRIX ROUTINE

The steps for implementing the Kerf Matrix Routine are shown below. Inputs are chip dimensions, tool weights, and N sets of tools.

Step B1—Initialize the cost value and result string to error values. The algorithm will output these error values if no solution is found.
  Best Cost equals 1000000
  Best Answer String="No answer found".
Step B2—Evaluate multiple sets of tools to select the tools that are most efficient for a given product:
  For each Set of Tools, run steps B4–B7
Step B3—Use rotated chip dimensions where that would give better results:
  For normal chip dimensions and for rotated chip dimensions, run steps B4–B7
Step B4—Execute the FIT subroutine (described below) for every kind of Kerf Matrix on the first tool:
  For each Kerf Matrix of the first tool, run steps B5–B7
Step B5—Execute the FIT subroutine (described below) for every kind of Chip Matrix on the first tool.
  For each chip matrix of the first tool, run steps B6–B7
Step B6—Find optimum Kerf Matricies for a set of lithographic tools and returns a Result String showing the Kerf Matrix found for each tool. All tools use the same Chip Matrix.
  Cost=FIT (kerf matrix, chip matrix, first tool ID, result string)
(The FIT subroutine is described below.)
Step B7—Save the best result:
  If Cost<Best Cost, Best Cost=Cost and Best Answer String=Result String from FIT
Step B8—Print the best result:
  Print the Best Answer String and the Best Cost.

FIT ROUTINE

The steps in implementing the Fit Routine are shown below. Inputs to the routine are Kerf Matrix, Chip Matrix, and Tool ID. Outputs from the routine are the Cost and Result String.

Step F1—Estimates the number of shots to process the wafer:
  nShots=42650*area of this Kerf Matrix**-1.0596.
Step F2—Calculate the processing cost for a specific Unit Cell and Kerf Matrix on a single tool type. The result is the BaseCost:
  BaseCost=tool's cost per hour/tool's stepping rate in shots/hour*number of levels for this tool in this set of tools*nShots*tool weight
Step F3—Determine whether all tools have been considered:
  If this is the last tool, then NextCost=0
Step F4—If this is not the last tool, consider every kind of Kerf Matrix on the next tool, and make a recursive call to the FIT routine. (The FIT subroutine calls itself and adds the character string of the next tool.) This will find the cost and matrixing to be used on all the other tools.
  For each Kerf Matrix of the next tool, NextCost=FIT (Kerf Matrix, Chip Matrix, next Tool ID, Next Tool's Result String)
Step F5—Save the cost and matrixing information from the other tools:
  Save the best NextCost found above, and the corresponding Kerf Matrix and Next Tool's Result String that was used to get it
Step F6—Build the Results String, describing how to process the current tool:
  Result String=current Tool ID, Chip Matrix, Kerf Matrix, and BaseCost.
Step F7—Append the results for all the later tools to he Result String:
  Result String=Result String+Next Tool's Result String
Step F8—Set the return value to the cost of processing on the current and on all remaining tools:
  Cost=BaseCost+NextCost
Step F9—Describe the Tool ID, Chip Matrix, Kerf Matrix, and BaseCost for each tool in the set of tools by the Result String returned. All tools have the same Chip Matrix. The string shows the best Kerf Matrix for each tool type. Each tool may use a different Kerf Matrix. The cost returned by the function is the processing cost for a single wafer using the given Chip Matrix and Kerf Matrix on the first tool, and an optimum Kerf Matrix for each of the other tools:
  Return the Result String and the Cost.

Step reduction has been shown to be the most significant lithographic tool productivity opportunity for semiconductor fabricators. The present invention provides a method for optimizing chip aspect ratio and size for a given set of different lithographic tools based on lowest cost of production. The method of the present invention may be implemented in varying degrees depending on the unique situations present at each fabricator. Productivity improvements of up to 20% are anticipated.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of optimizing efficiency of chip shape layout printed on semiconductors by a plurality of lithography tools comprising the steps of:
  a) providing a plurality of lithography tools for printing different layers or areas of chips on a semiconductor wafer;

b) determining, for each of said lithography tools, possible unit cells and unit cell matrices printable by said tool at one exposure and at one chip aspect ratio, wherein a unit cell comprises a matrix of one or more chips to be printed;

c) determining, for each of said lithography tools, an overall tool cost based on said possible unit cells and unit cell matrices;

d) determining, for each of said lithography tools, a desired unit cell matrix based on cost;

e) repeating steps (b)–(d) for a different chip aspect ratio having the same area; and f) selecting a desired chip aspect ratio, based on cost, for printing on different layers or areas on a semiconductor wafer using said plurality of lithography tools, wherein the cost equals any cost factor.

2. The method of claim 1 wherein step (d) determination of desired unit cell matrix is based on lowest cost.

3. (amended) The method of claim 1 wherein step (f) selection of desired chip aspect ratio is based on lowest monetary cost.

4. The method of claim 1 wherein chip dimensions in the unit cell are rotated by 90° with respect to a tool lens field to determine a desired unit cell matrix based on cost.

5. The method of claim 1 wherein the first aspect ratio in step (b) is one and said step (e) is repeated for larger aspect ratios up to a maximum desired aspect ratio.

6. The method of claim 1 wherein a weighting factor is determined for selected lithography tools and wherein said weighting factor is used to determine a desired chip aspect ratio based on cost.

7. The method of claim 1 wherein all of the unit cell matrices for each lithography tool determined in step (b) are multiples of one another.

8. The method of claim 1 wherein not all of the unit cell matrices for each lithography tool determined in step (b) are multiples of one another.

9. A method of optimizing efficiency of chip shape layout printed on semiconductors by a plurality of lithography tools comprising the steps of:

a) providing a plurality of lithography tools for printing different layers or areas of chips on a semiconductor wafer;

b) determining, for each of said lithography tools, possible unit cells and unit cell matrices printable by said tool at one exposure and at one chip aspect ratio, wherein a unit cell comprises a matrix of one or more chips to be printed;

c) determining, for each of said lithography tools, an overall tool cost based on said possible unit cells and unit cell matrices;

d) determining, for each of said lithography tools, a desired unit cell matrix based on cost;

e) repeating steps (b)–(d) for a plurality of increasing chip aspect ratios having the same area; and f) selecting a desired chip aspect ratio, based on monetary cost, for printing on different layers or areas on a semiconductor wafer using said plurality of lithography tools.

10. The method of claim 9 wherein step (d) determination of desired unit cell matrix is based on lowest cost.

11. The method of claim 9 wherein chip dimensions in the unit cell are rotated by 90° with respect to a tool lens field to determine a desired unit cell matrix based on cost.

12. The method of claim 9 wherein the first aspect ratio in step (b) is one and said step (e) is repeated for larger aspect ratios up to a maximum desired aspect ratio.

13. The method of claim 9 wherein a weighting factor is determined for selected lithography tools and wherein said weighting factor is used to determine a desired chip aspect ratio based on cost.

14. The method of claim 9 wherein all of the unit cell matrices for each lithography tool determined in step (b) are multiples of one another.

15. The method of claim 9 wherein not all of the unit cell matrices for each lithography tool determined in step (b) are multiples of one another.

16. A method of optimizing efficiency of chip shape layout printed on semiconductors by a plurality of lithography tools comprising the steps of:

a) providing a plurality of lithography tools for printing different layers or areas of chips on a semiconductor wafer;

b) determining a weighting factor for each of said lithography tools c) determining, for each of said lithography tools, possible unit cells and unit cell matrices printable by said tool at one exposure and at one chip aspect ratio, wherein a unit cell comprises a matrix of one or more chips to be printed;

d) determining, for each of said lithography tools, an overall tool cost based on said possible unit cells and unit cell matrices;

e) determining, for each of said lithography tools, a desired unit cell matrix based on cost;

f) repeating steps (c)–(e) for a different unit cell aspect ratio having the same area; and g) selecting a desired unit cell aspect ratio, based on cost, for printing on different layers or areas on a semiconductor wafer using said plurality of lithography tools, wherein the cost equals any cost factor.

17. The method of claim 16 wherein steps (e) and (g) determination of desired unit cell matrix and selection of chip aspect ratio, respectively, is based on lowest monetary cost.

18. The method of claim 16 wherein chip dimensions in the unit cell are rotated by 90° with respect to a tool lens field to determine a desired unit cell matrix based on cost.

19. The method of claim 16 wherein the first aspect ratio in step (c) is one and said step (f) is repeated for larger aspect ratios up to a maximum desired aspect ratio.

* * * * *